United States Patent
Zhou et al.

(10) Patent No.: US 11,936,408 B2
(45) Date of Patent: Mar. 19, 2024

(54) MATCHING CIRCUIT, RADIO FREQUENCY FRONT-END POWER AMPLIFICATION CIRCUIT, AND MOBILE COMMUNICATION DEVICE

(71) Applicant: LANSUS TECHNOLOGIES INC., Shenzhen (CN)

(72) Inventors: Jiahui Zhou, Shenzhen (CN); Hua Long, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 18/352,272

(22) Filed: Jul. 14, 2023

(65) Prior Publication Data

US 2023/0361792 A1 Nov. 9, 2023

Related U.S. Application Data

(63) Continuation of application No. PCT/CN2022/090482, filed on Apr. 29, 2022.

(30) Foreign Application Priority Data

Aug. 19, 2021 (CN) .......................... 202110951884.9

(51) Int. Cl.
*H04B 1/00* (2006.01)
*H03F 1/26* (2006.01)
(Continued)

(52) U.S. Cl.
CPC ......... *H04B 1/0057* (2013.01); *H04B 1/0458* (2013.01)

(58) Field of Classification Search
None
See application file for complete search history.

(56) References Cited

U.S. PATENT DOCUMENTS 10,886,894 B2 * 1/2021 Genji ....................... H04B 1/18
11,139,783 B2 * 10/2021 Zhou ..................... H03F 1/0205
(Continued)

FOREIGN PATENT DOCUMENTS

CN 1249079 A 3/2000
CN 104242829 A * 12/2014 ............. H03F 1/565
(Continued)

OTHER PUBLICATIONS

Qing-Yi Guo: "Bandpass Class-F Power Amplifier Based on Multifunction Hybrid Cavity-Microstrip Filter", «IEEE Transactions on Circuits and Systems II: Express Briefs», pp. 742-746, Issue date Aug. 16, 2016.
(Continued)

*Primary Examiner* — Pablo N Tran

(57) ABSTRACT

A matching circuit, a radio frequency front-end power amplification circuit, and a mobile communication device are provided. The matching circuit is configurable for the radio frequency front-end power amplification circuit, including a first impedance matcher, a first bandpass filter, a first wave trap, and a first matching unit. An impedance of the first impedance matcher is a first preset impedance at a first frequency, the first bandpass filter is bridged between a front end of the first impedance matcher and ground, the first bandpass filter enables a signal of the first frequency to pass through, and suppresses at least one of a signal of a second frequency and a signal of third harmonic generation of the first frequency. The second frequency is lower than the first frequency. The first wave trap is bridged between a rear end of the first impedance matcher and the ground.

9 Claims, 3 Drawing Sheets

Matching structure for bandpass filter

(51) Int. Cl.
H03F 3/191 (2006.01)
H03F 3/21 (2006.01)
H04B 1/04 (2006.01)

(56) References Cited

U.S. PATENT DOCUMENTS

| | | | |
|---|---|---|---|
| 2005/0212595 A1 | | 9/2005 | Kusunoki et al. |
| 2007/0176688 A1* | | 8/2007 | Frei .......... H03F 3/191 |
| | | | 330/302 |
| 2020/0028478 A1* | | 1/2020 | Li .......... H03F 3/2171 |

FOREIGN PATENT DOCUMENTS

| | | | | |
|---|---|---|---|---|
| CN | 104242829 A | | 12/2014 | |
| CN | 106464223 A | * | 2/2017 | ........... H03H 7/0115 |
| CN | 106559048 A | | 4/2017 | |
| CN | 108011599 A | | 5/2018 | |
| CN | 108964621 A | | 12/2018 | |
| CN | 109167582 A | | 1/2019 | |
| CN | 109714011 A | | 5/2019 | |
| CN | 208904969 U | | 5/2019 | |
| JP | S60236501 A | | 11/1985 | |
| WO | 2020005231 A1 | | 1/2020 | |

OTHER PUBLICATIONS

Zhu Xinghua: "Research on Online Monitoring of Impedance Matching in Medium Wave Antenna Networks", «Broadcasting and Television Technology», pp. 105-112, Issue date Jul. 30, 2021.
Wang Jiaxiang: «Electronic System Design«,Sep. 30, 2012, Xidian University Press, p. 148.

* cited by examiner

MATCHING CIRCUIT, RADIO FREQUENCY FRONT-END POWER AMPLIFICATION CIRCUIT, AND MOBILE COMMUNICATION DEVICE

TECHNICAL FIELD

The present disclosure relates to a technical field of mobile communications, and in particular to a matching circuit, a radio frequency front-end power amplification circuit, and a mobile communication device.

BACKGROUND

Radio frequency amplification circuit, as an important part of a mobile phone communication system, is mainly configurable for amplifying signals. Since the mobile phone communication system increasingly develops, requirements for power of mobile phone power amplifiers become higher and higher. The increase in transmit power of a power amplifier (PA) may result in higher harmonics and worse spurious metrics, and deterioration of harmonics and spurious of the PA may seriously affect quality of communication. Therefore, matching circuits at a rear end of the PA need to have higher suppression capability for the harmonics and the spurious of the PA.

Currently, harmonic suppression capability and low-frequency spurious suppression capability of the matching circuits of the PA are insufficient, and circuits of which are relatively complex and are not easy to implement, so that technical requirements are difficult to meet.

SUMMARY

In view of above, the present disclosure provides a matching circuit for a radio frequency front-end power amplifier, including a first impedance matcher, a first bandpass filter, a first wave trap, and a first matching unit. An impedance of the first impedance matcher is a first preset impedance at a first frequency, the first bandpass filter is bridged between a front end of the first impedance matcher and ground, the first bandpass filter enables a signal of the first frequency to pass through, and suppresses at least one of a signal of a second frequency and a signal of third harmonic generation of the first frequency. The second frequency is lower than the first frequency. The first bandpass filter includes a first resonator and a second resonator, the first resonator and the second resonator are connected in series. The first resonator includes a first inductor and a first capacitor, the first inductor and the first capacitor are connected in parallel. The second resonator includes a second inductor and a second capacitor, the second inductor and the second capacitor are connected in series. The first wave trap is bridged between a rear end of the first impedance matcher and the ground, to suppress a signal of second harmonic generation of the first frequency. The first matching unit is connected to the front end of the first impedance matcher. The first matching unit includes a third inductor, a fourth inductor, a fifth inductor, and a third capacitor, the third inductor, the fourth inductor, the fifth inductor, and the third capacitor are connected in series. The first matching unit further includes a sixth inductor, a seventh inductor, an eighth inductor, a fourth capacitor, a fifth capacitor, and a sixth capacitor. The sixth inductor and the fourth capacitor are connected in series, and are bridged between a connection point, of the third inductor and the fourth inductor, and the ground. The seventh inductor and the fifth capacitor are connected in series, and are bridged between a connection point, of the fourth inductor and the fifth inductor, and the ground. The eighth inductor and the sixth capacitor are connected in series, and are bridged between a connection point, of the fifth inductor and the third capacitor, and the ground. The first frequency is within a working frequency band ranged from 1.710 GHz-1.785 GHz and/or 1.850 GHz-1.910 GHz. The second frequency is within a frequency band ranged from 820 MHz-920 MHz.

Furthermore, the first resonator and the second resonator are resonated in series at the second frequency and a frequency of a first harmonic signal of the signal of the first frequency.

Furthermore, the first impedance matcher includes a ninth inductor and a seventh capacitor, the ninth inductor and the seventh capacitor are connected in series.

Furthermore, the ninth inductor and the seventh capacitor are resonated at the first frequency.

Furthermore, the first wave strap includes a tenth inductor and an eighth capacitor, the tenth inductor and the eighth capacitor are connected in series.

Furthermore, the tenth inductor and the eighth capacitor are resonated at a second harmonic signal of the signal of the first frequency.

Furthermore, the first harmonic signal is a third-order harmonic of the signal of the first frequency, the second harmonic signal is a second-order harmonic of the signal of the first frequency, and the first preset impedance is 50 ohms.

The present disclosure further provides a radio frequency front-end power amplification circuit, including the matching circuit and a radio frequency power amplifier, the radio frequency power amplifier is connected to the matching circuit.

The present disclosure further provides a mobile communication device, including the radio frequency power amplifier, or the matching circuit.

The present disclosure further provides a chip, including the radio frequency front-end power amplification circuit, or the matching circuit.

The matching circuit, the radio frequency front-end power amplification circuit, and the mobile communication device may better suppress harmonics of in-band signals, thereby achieving better effect for suppressing second-order harmonics, third-order harmonics, and higher order harmonics of the in-band signals. Meanwhile, the matching circuit has a good effect for suppressing low-frequency spurious noise, the matching circuit provided by the present disclosure may optimize low-frequency spurious while suppressing the harmonics for killing two birds with one stone.

For example, current mobile communication devices generally need to process multi-mode signals, and in particular, to process a frequency band signal of a global system for mobile communications (GSM) while processing signals of a digital cellular system at 1800 MHz (DCS1800) and/or a personal communications service at 1900 MHz (PCS1900). In the mobile communication devices, for a power amplification circuit to process the signals of the DCS1800 and/or the PCS1900, the signals of the DCS1800 and/or the PCS1900 are in-band signals, and harmonic signals in the in-band signals and the frequency band signal of the GSM become main interference sources. The matching circuit provided by the present disclosure may effectively suppress interference caused by the main interference sources, thereby reducing the corresponding affect, meanwhile, the matching circuit is relatively simple in structure, which is easy to implement.

BRIEF DESCRIPTION OF DRAWINGS

In order to more clearly illustrate technical solutions in embodiments of the present disclosure, accompanying drawings that need to be used in description of the embodiments are briefly described below.

DETAILED DESCRIPTION

Figure 1:
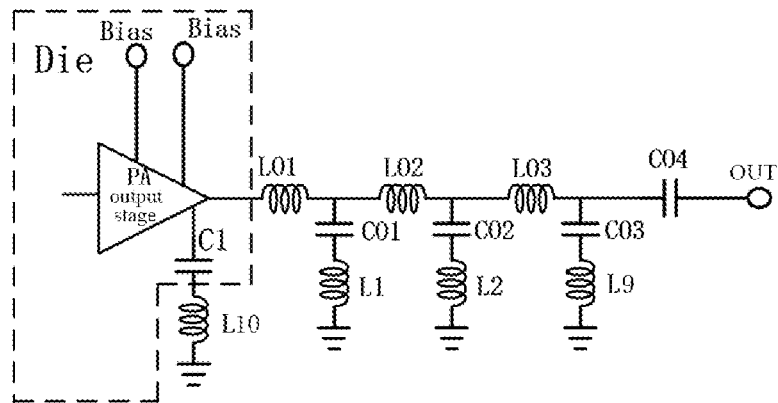
FIG. 1 is a schematic diagram of a topology structure of a radio frequency front-end power amplification circuit in the prior art.

FIG. 1 is a schematic diagram of a topology structure of a radio frequency front-end power amplification circuit in the prior art.

As shown in FIG. 1, the radio frequency front-end power amplification circuit may include a power amplifier PA and a filter circuit composed of $L_{01}$-$L_{03}$, $C_{01}$-$C_{04}$, and $L_1$-$L_3$.

In the prior art, mobile communication devices generally need to integrate and process multi-mode communication signals. For example, the mobile communication devices may need to simultaneously process multi-mode communication signals including at least two of working frequency bands ranged 1.710 GHz-1.785 GHz of a digital cellular system (DCS), 1.850 GHz-1.910 GHz of a personal communications service (PCS), and 820 MHz-920 MHz of a global system for mobile communications (GSM).

When a circuit shown in FIG. 1 is a power amplification circuit for processing the DCS at 1.710 GHz-1.785 GHz and/or the PCS at 1.850 GHz-1.910 GHz, the DCS at 1.710 GHz-1.785 GHz and/or the PCS at 1.850 GHz-1.910 GHz may serve as the in-band signals, and harmonic signals in the in-band signals and a frequency band signal of the GSM become main interference sources.

Since the circuit shown in FIG. 1 cannot sufficiently suppress harmonic noise of the in-band signals and low-frequency spurious noise including the frequency band signal of the GSM, requirements are difficult to meet. Therefore, on a basis of the circuit shown in FIG. 1, the present disclosure provides a matching circuit as shown in FIG. 2.

Figure 2:
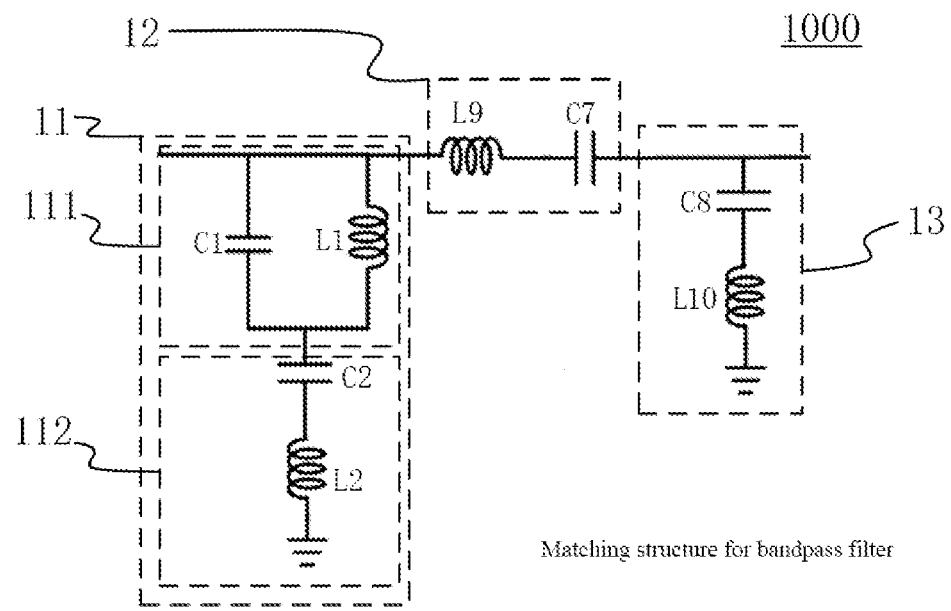
FIG. 2 is a schematic diagram of a topology structure of a matching circuit according to one embodiment of the present disclosure.

As shown in FIG. 2, the matching circuit 1000 includes an impedance matcher 12, a bandpass filter 11, and a wave trap 13. Furthermore, the matching circuit 1000 may be disposed at an output end of a radio frequency power amplification circuit. Furthermore, the matching circuit 1000 may be connected to an output end of the circuit shown in FIG. 1.

The impedance matcher 12 may be configurable for impedance matching, an impedance of the impedance matcher 12 is a first preset impedance at a first frequency. Furthermore, the first preset impedance may be 50Ω. The first frequency may be within a working frequency range of a power amplification circuit connected to the matching circuit 1000. For example, the first frequency is a center frequency of the working frequency range of the power amplification circuit. Furthermore, the working frequency range may include frequency bands ranged 1.710 GHz-1.785 GHz of the DCS and/or 1.850 GHz-1.910 GHz of the PCS. Furthermore, the impedance matcher 12 may include a ninth inductor $L_9$ and a seventh capacitor $C_7$, the ninth inductor $L_9$ and the seventh capacitor $C_7$ are connected in series. Furthermore, the ninth inductor $L_9$ and the seventh capacitor $C_7$ may be resonated near the first frequency. Furthermore, parameter values of the ninth inductor $L_9$ and the seventh capacitor $C_7$ may be configured according to parameters of a tenth inductor $L_{10}$ and an eighth capacitor $C_8$, so that an input impedance and an output impedance of the matching circuit 1000 are the first preset impedance.

As shown in FIG. 2, the bandpass filter 11 may be bridged between a front end of the impedance matcher 12 and ground. The first bandpass filter 11 enables a signal of the first frequency to pass through, and suppresses a first harmonic signal of the signal of the first frequency and a noise signal near a second frequency, where the first harmonic signal may be a third-order harmonic of the signal of the first frequency, and the second frequency may be within a frequency band ranged 820 MHz-920 MHz of the GSM. Furthermore, the bandpass filter 11 may include a first resonator 111 and a second resonator 112, the first resonator 111 and the second resonator 112 are connected in series. Furthermore, the first resonator 111 may include a first capacitor $C_1$ and a first inductor $L_1$, the first capacitor $C_1$ and the first inductor $L_1$ are connected in parallel. The second resonator 112 may include a second capacitor $C_2$ and a second inductor $L_2$, the second capacitor $C_2$ and the second inductor $L_2$ are connected in series.

Furthermore, the first resonator 111 may be resonated at a frequency between the second frequency and a first harmonic frequency, and the first harmonic frequency may be third harmonic generation of the first frequency. The second resonator 112 may also be resonated at the frequency between the second frequency and the first harmonic frequency. Furthermore, the first resonator 111 and the second resonator 112 may be resonated at the same frequency. Furthermore, the first resonator 111 and the second resonator 112 may be resonated at the second frequency and the first harmonic frequency in series. For example, an impedance of the first resonator 111 may be expressed as $$Z_{111} = \frac{1}{j\omega C_1 + \frac{1}{j\omega L_1}} = \frac{j\omega L_1}{1 - \omega^2 L_1 C_1}, \tag{1}$$

an impedance of the second resonator 112 may be expressed as $$z_{112} = j\omega L_2 + \frac{1}{j\omega C_2} = \frac{1 - \omega^2 L_2 C_2}{j\omega C_2}, \text{ and}$$

$$\omega_\alpha = \frac{1}{\sqrt{L_1 C_1}} \text{ and } \omega_\beta = \frac{1}{\sqrt{L_{06} C_{06}}}$$

are satisfied.

According to the formula (1), the first resonator 111 is resonated at $\omega_\alpha$. When $\omega < \omega_\alpha$, $Z_{111}$ is capacitive; and when $\omega > \omega_\alpha$, $Z_{111}$ is inductive. According to the formula (2), the second resonator 112 is resonated at $\omega_\beta$. When $\omega<\omega_\beta$, $Z_{112}$ is inductive; and when $\omega>\omega_\beta$, $Z_{112}$ is capacitive. Furthermore, the first resonator 111 and the second resonator 112 may be resonated at the same frequency, that is, $L_1C_1=L_2C_2$.

An impedance of the bandpass filter 11 may be expressed as $$Z_{11} = Z_{111} + Z_{112} = \frac{j\omega L_1}{1-\omega^2 L_1 C_1} + \frac{1-\omega^2 L_2 C_2}{j\omega C_2} = \qquad (3)$$

$$\frac{\omega^4 L_1 L_2 C_1 C_2 - \omega^2(L_1 C_1 + L_1 C_2 + L_2 C_2) + 1}{j\omega C_1(1-\omega^2 L_2 C_2)}.$$

Obviously, there are four roots with the equation $\omega^4 L_1 L_2 C_1 C_2 - \omega^2(L_1 C_1 + L_1 C_2 + L_2 C_2) + 1$ of $\omega$, the four roots may be divided into two pairs, and roots in each pair are opposite to each other. The two pairs of the four roots are respectively corresponded to the second frequency and the first harmonic frequency through reasonably configuring parameters of the first capacitor $C_1$, the second capacitor $C_2$, the first inductor $L_1$, and the second inductor $L_2$. Therefore, the impedance $Z_{11}$ of the bandpass filter 11 may be very small when the bandpass filter 11 is near the second frequency or near the first harmonic frequency, which is close to zero. Therefore, the bandpass filter 11 greatly attenuates the second frequency and the first harmonic frequency.

Figure 3:
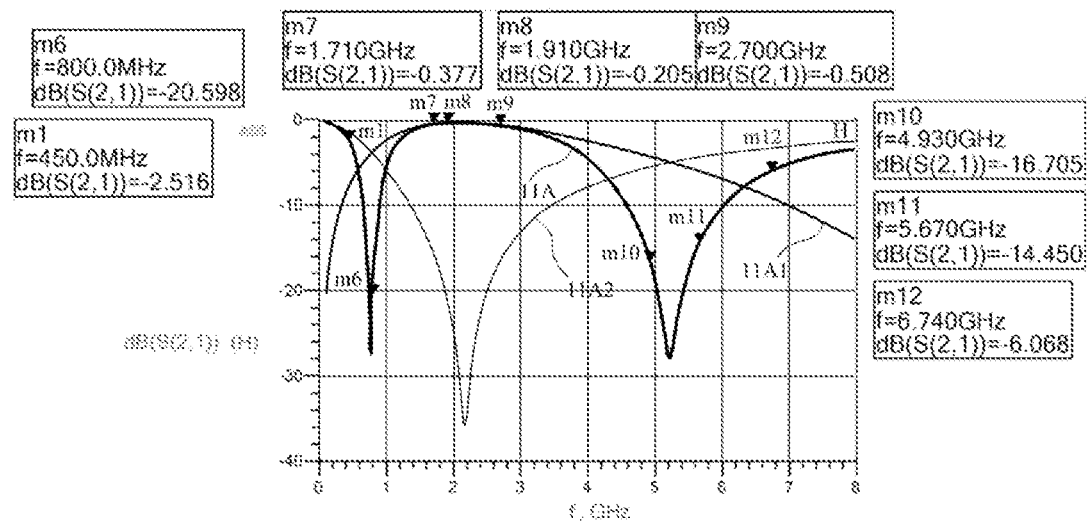
FIG. 3 is a schematic diagram of a transmission gain curve of a bandpass filter 11 in the matching circuit shown in FIG. 2.

FIG. 3 is a schematic diagram of a transmission gain curve of the bandpass filter 11 in the matching circuit shown in FIG. 2.

As shown in FIG. 3, 11A1 is a transmission gain curve separately configuring the first resonator 111 as a filter. 11A2 is a transmission gain curve separately configuring the second resonator 112 as the filter. 11A is a transmission gain curve of the bandpass filter 11. Based on FIG. 3, a transmission gain of the bandpass filter 11 at a frequency of m6=800 MHz (near the second frequency) is −20.598 dB, that is, the bandpass filter 11 attenuates a frequency of 800 MHz by more than 20 dB. A transmission gain of the bandpass filter 11 at a frequency of m10=4.93 GHz is −16.705 dB, a transmission gain of the bandpass filter 11 at a frequency of m11=5.67 GHz is −14.45 dB, that is, the bandpass filter 11 attenuates a frequency by more than 14 dB within frequencies ranged 4.93 GHz-5.67 GHz. Obviously, the bandpass filter has obvious attenuation effect near the second frequency and near the first harmonic frequency.

As shown in FIG. 2, the wave trap 13 may be bridged between a rear end of the first impedance matcher 12 and the ground. The wave trap 13 may be matched with the impedance matcher 12 for impedance matching, and may be configured to suppress a second harmonic signal of the signal of the first frequency. Furthermore, the second harmonic signal may be a second-order harmonic of the signal of the first frequency. The wave trap 13 may include the eighth capacitor $C_8$ and the tenth inductor $L_{10}$, the eighth capacitor $C_8$ and the tenth inductor $L_{10}$ are connected in series. Furthermore, the eighth capacitor $C_8$ and the tenth inductor $L_{10}$ may be resonated near a frequency of the second harmonic signal.

Furthermore, the matching circuit 1000 may be disposed between an output end of a power amplifier and an antenna.

Figure 4:
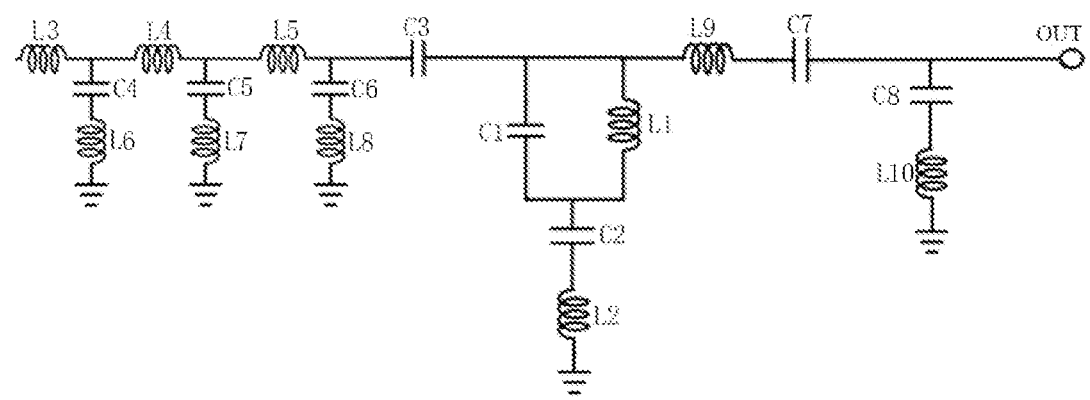
FIG. 4 is a schematic diagram of another topology structure of the matching circuit shown in FIG. 2.

FIG. 4 is a schematic diagram of another topology structure of the matching circuit shown in FIG. 2.

Furthermore, the matching circuit 1000 may further include a first matching unit (not shown in the drawings). The first matching unit may be connected to the front end of the impedance matcher 12. The first matching unit may include a third inductor $L_3$, a fourth inductor $L_4$, a fifth inductor $L_5$, and a third capacitor $C_3$, the third inductor $L_3$, the fourth inductor $L_4$, the fifth inductor $L_5$, and the third capacitor $C_3$ are connected in series.

The first matching unit further includes a sixth inductor $L_6$, a seventh inductor $L_7$, an eighth inductor $L_8$, a fourth capacitor $C_4$, a fifth capacitor $C_5$, and a sixth capacitor $C_6$. The sixth inductor $L_6$ and the fourth capacitor $C_4$ are connected in series, and are bridged between a connection point, of the third inductor $L_3$ and the fourth inductor $L_4$, and the ground. The seventh inductor $L_7$ and the fifth capacitor $C_5$ are connected in series, and are bridged between a connection point, of the fourth inductor $L_4$ and the fifth inductor $L_5$, and the ground. The eighth inductor $L_8$ and the sixth capacitor $C_6$ are connected in series, and are bridged between a connection point, of the fifth inductor $L_5$ and the third capacitor $C_3$, and the ground.

Figure 5:
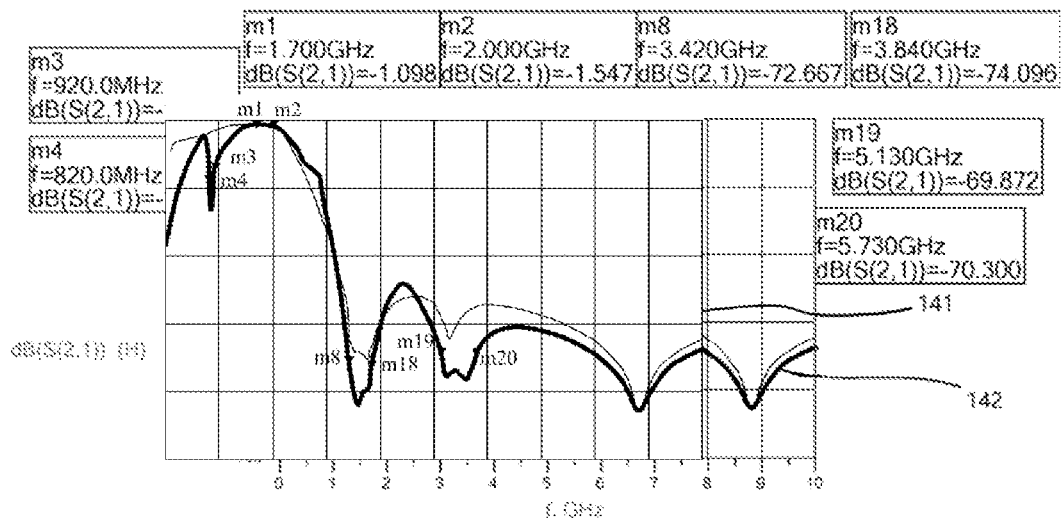
FIG. 5 is schematic diagram of a gain comparison waveform for whether the matching circuit shown in FIG. 2 is cascaded based on the radio frequency front-end power amplification circuit shown in FIG. 1.

FIG. 5 is schematic diagram of a gain comparison waveform for whether the matching circuit shown in FIG. 2 is cascaded based on the radio frequency front-end power amplification circuit shown in FIG. 1.

As shown in FIG. 5, a curve 141 is a gain curve of the radio frequency front-end power amplification circuit shown in FIG. 1, a curve 142 is a gain curve of the radio frequency front-end power amplification circuit shown in FIG. 1 after cascading the matching circuit 1000.

As shown in FIG. 5, the curve 142 attenuates by 1.098 dB with respect to the curve 141 at a frequency of m1=1.7 GHz; and the curve 142 attenuates by 1.547 dB with respect to the curve 141 at a frequency of m2=2 GHz. That is, for signals with frequencies ranged 1.7-2 GHz (range of working frequencies), an attenuation amount generated by the matching circuit is small and may be ignored.

As shown in FIG. 5, the curve 142 attenuates by 15.541 dB with respect to the curve 141 at a frequency of m3=920 MHz; and the curve 142 attenuates by 18.631 dB with respect to the curve 141 at a frequency of m3=820 MHz. That is, for noise signals with frequencies ranged 820-920 MHz (GSM signals), the matching circuit 1000 may generate an attenuation of more than 15 dB.

As shown in FIG. 5, the curve 142 attenuates by 72.667 dB with respect to the curve 141 at a frequency of m8=3.4 GHz; and the curve 142 attenuates by 74.096 dB with respect to the curve 141 at a frequency of m18=3.84 GHz. That is, for harmonic noise with frequencies ranged 3.4-3.84 GHz (second-order harmonics of the working frequencies), the matching circuit 1000 may achieve a suppression effect of more than 70 dB.

As shown in FIG. 5, the curve 142 attenuates by 69.872 dB with respect to the curve 141 at a frequency of m19=5.13 GHz; and the curve 142 attenuates by 70.3 dB with respect to the curve 141 at a frequency of m20=5.73 GHz. That is, for harmonic noise with frequencies ranged 5.13-5.73 GHz (third-order harmonics of the working frequencies), the matching circuit 1000 may achieve a suppression effect of about 70 dB.

Figure 6:
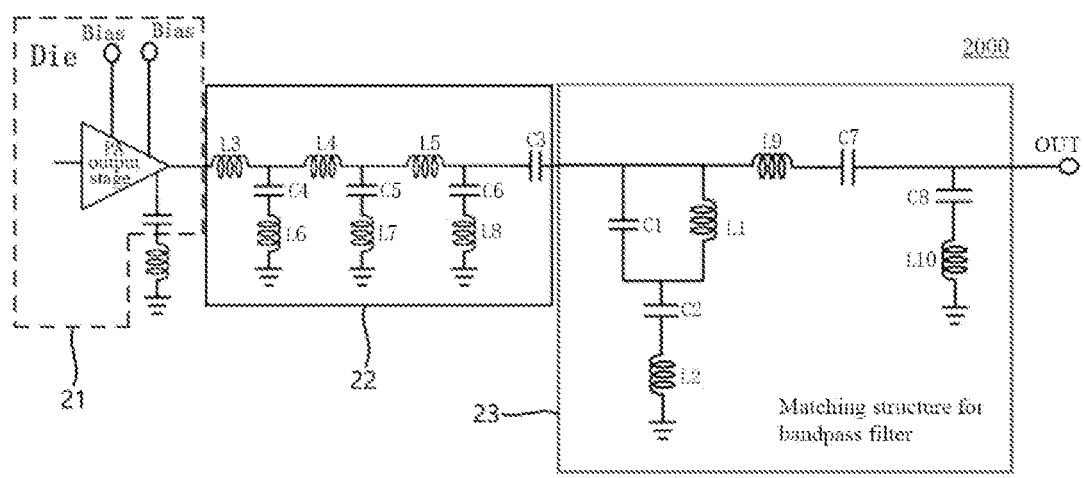
FIG. 6 is a schematic diagram if a topology structure of a radio frequency front-end power amplification circuit according to another embodiment of the present disclosure.

FIG. 6 is a schematic diagram if a topology structure of a radio frequency front-end power amplification circuit according to another embodiment of the present disclosure.

The radio frequency front-end power amplification circuit 2000 shown in FIG. 6 may include a power amplifier 21, a filter circuit 22, and a matching circuit 23. The filter circuit 22 and the matching circuit 23 are cascaded to an output end of the power amplifier 21. The filter circuit 22 and the power amplifier 21 constitute the radio frequency front-end power amplification circuit in the prior art. The matching circuit 23 may be any one of the foregoing matching circuit.

Furthermore, the radio frequency front-end power amplification circuit 2000 process in-band signals including signals of the DCS at 1.710 GHz-1.785 GHz and/or signals of the PCS at 1.850 GHz-1.910 GHz. The matching circuit 23 may enhance suppression for harmonics of the in-band signals, and may further enhance suppression for low-frequency noise including a frequency band of the GSM.

The present disclosure further provides a mobile communication device, including any one of the foregoing matching circuit or any one of the foregoing radio frequency front-end power amplification circuit. Furthermore, the mobile communication device may include a mobile phone, a tablet computer, a laptop computer, etc. Furthermore, the mobile communication device may simultaneously process signals of the frequency band of the GSM and the signals of the DCS at 1.710 GHz-1.785 GHz. Or, the mobile communication device may simultaneously process signals of the frequency band of the GSM and the signals of the PCS at 1.850 GHz-1.910 GHz.

The present disclosure further provides a chip, including any one of the foregoing radio frequency front-end power amplification circuit, or the foregoing matching circuit.

The matching circuit, the radio frequency front-end power amplification circuit, and the mobile communication device may better suppress the harmonics of the in-band signals, thereby achieving better effect for suppressing second-order harmonics, third-order harmonics, and higher order harmonics of the in-band signals. Meanwhile, the matching circuit has a good effect for suppressing low-frequency spurious noise, the matching circuit provided by the present disclosure may optimize low-frequency spurious while suppressing the harmonics for killing two birds with one stone.

For example, current mobile communication devices generally need to process multi-mode signals, and in particular, to process a frequency band signal of a global system for mobile communications (GSM) while processing signals of a digital cellular system at 1800 MHz (DCS1800) and/or a personal communications service at 1900 MHz (PCS1900). In the mobile communication devices, for a power amplification circuit to process the signals of the DCS1800 and/or the PCS1900, the signals of the DCS1800 and/or the PCS1900 are in-band signals, and harmonic signals in the in-band signals and the frequency band signal of the GSM become main interference sources. The matching circuit provided by the present disclosure may effectively suppress interference caused by the main interference sources, thereby reducing the corresponding affect, meanwhile, the matching circuit is relatively simple in structure, which is easy to implement.

The embodiments of the present disclosure are described in detail above, and specific examples are used herein to describe principles and implementation modes of the present disclosure, and the description of the above embodiments is merely used to help understand a method of the present disclosure and a core idea thereof. Meanwhile, changes or deformations made by those who skilled in the art based on the specific implementation modes and scopes of the present disclosure according to the idea of the present disclosure belong to scopes of protection of the present disclosure. In summary, contents of the specification should not be construed as limiting the present disclosure.

What is claimed is:

1. A matching circuit, comprising:
a first impedance matcher;
a first bandpass filter;
a first wave trap; and
a first matching unit;
wherein an impedance of the first impedance matcher is a first preset impedance at a first frequency, the first bandpass filter is bridged between a front end of the first impedance matcher and ground, the first bandpass filter enables a signal of the first frequency to pass through, and suppresses at least one of a signal of a second frequency and a first harmonic signal of the signal of the first frequency; and the second frequency is lower than the first frequency;
the first bandpass filter comprises a first resonator and a second resonator, the first resonator and the second resonator are connected in series;
the first resonator comprises a first inductor and a first capacitor, the first inductor and the first capacitor are connected in parallel;
the second resonator comprises a second inductor and a second capacitor, the second inductor and the second capacitor are connected in series;
the first wave trap is bridged between a rear end of the first impedance matcher and the ground, to suppress a second harmonic signal of the signal of the first frequency;
the first matching unit is connected to the front end of the first impedance matcher;
the first matching unit comprises a third inductor, a fourth inductor, a fifth inductor, and a third capacitor, the third inductor, the fourth inductor, the fifth inductor, and the third capacitor are connected in series;
the first matching unit further comprises a sixth inductor, a seventh inductor, an eighth inductor, a fourth capacitor, a fifth capacitor, and a sixth capacitor;
the sixth inductor and the fourth capacitor are connected in series, and are bridged between a connection point, of the third inductor and the fourth inductor, and the ground;
the seventh inductor and the fifth capacitor are connected in series, and are bridged between a connection point, of the fourth inductor and the fifth inductor, and the ground;
the eighth inductor and the sixth capacitor are connected in series, and are bridged between a connection point, of the fifth inductor and the third capacitor, and the ground;
the first frequency is within a working frequency band ranged from 1.710 GHz-1.785 GHz and/or 1.850 GHz-1.910 GHz; and
the second frequency is within a frequency band ranged from 820 MHz-920 MHz.

2. The matching circuit according to claim 1, wherein the first resonator and the second resonator are resonated in series at the second frequency and a frequency of the first harmonic signal of the signal of the first frequency.

3. The matching circuit according to claim 1, wherein the first impedance matcher comprises a ninth inductor and a seventh capacitor, the ninth inductor and the seventh capacitor are connected in series.

4. The matching circuit according to claim 3, wherein the ninth inductor and the seventh capacitor are resonated at the first frequency.

5. The matching circuit according to claim 1, wherein the first wave strap comprises a tenth inductor and an eighth capacitor, the tenth inductor and the eighth capacitor are connected in series.

6. The matching circuit according to claim 5, wherein the tenth inductor and the eighth capacitor are resonated at the second harmonic signal of the signal of the first frequency.

7. The matching circuit according to claim 1, wherein the first harmonic signal is a third-order harmonic of the signal of the first frequency; the second harmonic signal is a second-order harmonic of the signal of the first frequency; and the first preset impedance is 50 ohms.

8. A radio frequency front-end power amplification circuit, comprising:
    the matching circuit according to claim 1; and
    a radio frequency power amplifier;
    wherein the radio frequency power amplifier is connected to the matching circuit.

9. A mobile communication device, comprising the radio frequency front-end power amplification circuit or the matching circuit according to claim 8.

\* \* \* \* \*